Feb. 13, 1962 C. FARQUHAR 3,021,493

TUNING DEVICES

Filed Aug. 22, 1960 2 Sheets-Sheet 1

INVENTOR.
Charles Farquhar
BY John J. Pederson
Atty.

INVENTOR.
Charles Farquhar
BY John J. Pederson
Atty.

United States Patent Office 3,021,493
Patented Feb. 13, 1962

3,021,493

TUNING DEVICES

Charles Farquhar, Lombard, Ill., assignor to Zenith Radio Corporation, a corporation of Delaware Filed Aug. 22, 1960, Ser. No. 50,903
8 Claims. (Cl. 333—78)

This invention relates to inductive tuning devices and more particularly to miniaturized tuning devices such as intermediate-frequency transformers used in transistor pocket radios and the like.

With the advent of the transistor upon the commercial scene a few years ago, efforts were made to miniaturize many types of electrical devices that had been using vacuum tubes. Since the space requirement of a transistor is quite small when compared to a vacuum tube, a very large size reduction can be effectuated. The miniaturizing of electrical devices by replacing vacuum tubes with transistors lends greatly increased emphasis to the importance of miniaturizing other components of the electrical device, as for example the IF or intermediate-frequency transformer of a miniaturized transistor radio. However, as IF transformers are reduced in size the problem arises as to how to retain the required amount of inductance and "Q" (Quality factor) for the electrical circuit in which the IF transformer is to be utilized. As the size of this type of transformer is reduced, its losses are proportionately increased if the dimensions of the device are just scaled down to the smaller size desired. This increase in losses causes a reduction in "Q" (which is a ratio of impedance over the losses of an inductive device) and also a reduction in inductance.

It is a primary object of this invention to provide a new and improved miniaturized inductive tuning device.

It is a further object of this invention to provide a new and improved miniaturized intermediate-frequency transformer for use in pocket radios and the like.

It is another object of this invention to provide a miniaturized inductive tuning device which can be simply and inexpensively constructed.

In accordance with the present invention, an intermediate-frequency transformer for use in miniaturized radios and the like comprises a cylindrical core of high-permeability ferrite material with primary and secondary windings encompassing the core. A support member of insulating material including a base portion and a pair of spaced vertically extending members receives and maintains the cylindrical core with its axis horizontally oriented. The vertically extending members each have a cylindro-segmental external bearing surface intermediate the core and the base portion. A cup-shaped ferrite tuning member surrounds the core and comprises a ring portion and a lip portion having a cylindrical internal surface in slidable frictional engagement with the external bearing surfaces of the vertically extending members. A magnetic circuit is established which includes the ring portion and the core with a pair of air gaps at least one being adjustable by rotation of the tuning member.

The features of the present invention which are believed to be novel are set forth with particularity in the appended claims. The organization and manner of operation of the invention, together with further objects and advantages thereof, may best be understood by reference to the following description taken in connection with the accompanying drawings, in the several figures of which like reference numerals identify like elements, and in which:

Figure 1:
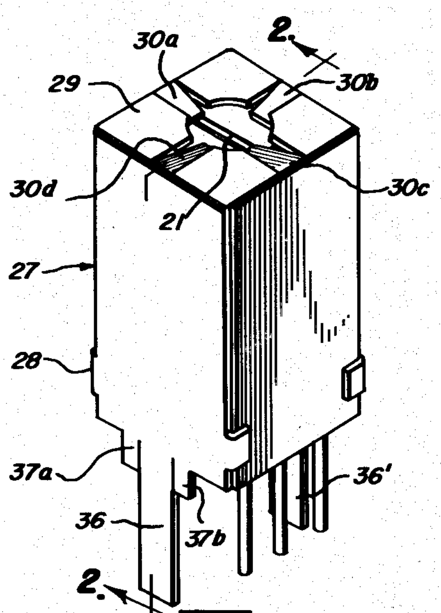
FIGURE 1 is a perspective view of an IF transformer embodying the invention.
Figure 2:
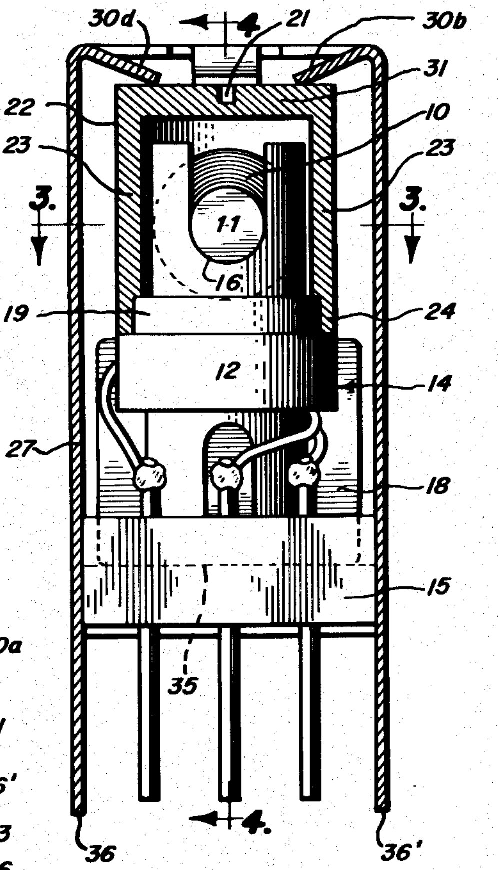
FIGURE 2 is a cross-sectional view taken along line 2—2 of FIGURE 1.
Figure 4:
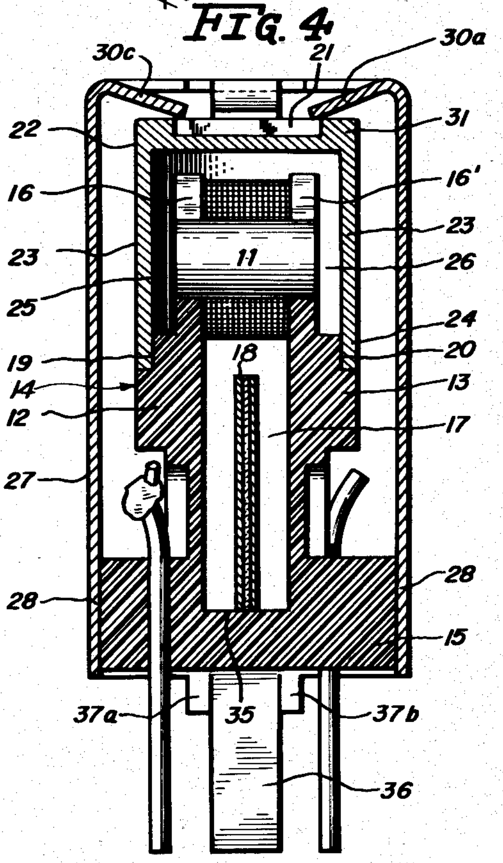
FIGURE 4 is a sectional view taken along line 4—4 of FIGURE 2.

Referring to the intermediate-frequency transformer of FIGURES 1–4, and particularly to FIGURE 2, primary and secondary windings 10 encompass a cylindrical ferromagnetic core 11 which is composed of a high-permeability ferrite material. Primary and secondary windings 10 may be layer wound or interwound in conventional fashion. A support member 14 includes a base portion 15 from which a pair of spaced vertical members 12 and 13 (see FIGURE 4) extend. Members 12 and 13 each include U-shaped notches 16 and 16' which support and maintain core 11 in a horizontal position as best shown in FIGURE 4. Between members 12 and 13 a vertically oriented receptacle 17 is provided which includes a slot 35 in base portion 15. Receptacle 17 contains a miniature wafer-type capacitor 18 which is connected in parallel with at least a portion of the primary winding. The capacitor is retained in place by its relatively rigid leads (not shown) which extend through base 15. Base portion 15 has a square outer configuration while the outer configuration of members 12 and 13 is cylindro-segmental; that is, the peripheral surface of each member has the form of a segment of a cylinder. Members 12 and 13 are shaped to provide cylindro-segmental external bearing surfaces 19 and 20 which are intermediate core 11 and receptacle 17.

Figure 3:
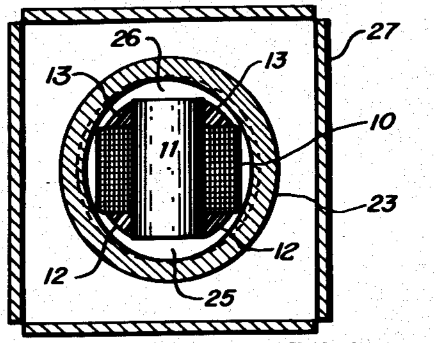
FIGURE 3 is a sectional view taken along line 3—3 of FIGURE 2.

A cup-shaped ferrite tuning member 22 surrounds core 11 and comprises a ring portion 23 of circular outer configuration and elliptical inner configuration, as best shown in FIGURE 3, and a base portion 31 having a slot 21. Member 22 also includes a lip portion 24 which has a threadless cylindrical internal surface, as best shown by the dashed lines in FIGURE 3, which is in slidable frictional engagement with cylindro-segmental bearing surfaces 19 and 20 of support member 14. Tuning member 22 and core 11 define a pair of air gaps 25 and 26 in the magnetic circuit consisting of core 11 and ring portion 23 of tuning member 22. Air gaps 25 and 26 extend from respective ends of core 11 to the inner elliptical surface of tuning member 22. When the minor axis of the ellipse which is formed by the inner surface of ring portion 23 is coincident with the axis of core 11, air gaps 2 and 26 are a minimum; conversely, when the major aixs of the elliptical inner surface of ring portion 23 is coincident with the axis of core 11, air gaps 25 and 26 are a maximum.

A shield can 27 (see FIGURE 1) of sheet brass or other electrically conductive material includes one end portion 28 which engages base portion 15 of support member 14 and another end portion 29 which is provided with resilient tabs 30$a$–30$d$ adapted to engage base 31 of tuning member 22 as best shown in FIGURES 2 and 4. Can 27 also includes legs 36 and 36' which are for insertion through appropriate slots of a radio chassis or the like to retain the IF transformer on the chassis. Projections 37$a$–37$d$ which extend from end portion 28 of can 27 are normally bent over onto base portion 15 thereby retaining member 22 in slightly compressional mating engagement with cylindro-segmental bearing surfaces 19 and 20 by means of resilient tabs 30$a$–30$d$, thus holding the entire assembly together within can 27.

In operation, the principal magnetic circuit comprises core 11 and ring portion 23 of tuning member 22. The major portion of the magnetic flux crosses air gap 25 from an end of core 11 into ring portion 23 of ferrite tuning member 22 where the flux separates into two semicircular paths around the ring portion, returning to the opposite end of core 11 through air gap 26. In FIGURE 3, tuning member 22 is shown in a reference position where the major axis of the elliptical inner surface is coincident with the axis of core 11; in this position air gaps 25 and 26 are a maximum thereby causing a maximum reluctance in the magnetic circuit. A 90° rotation of tuning member 22 by a suitable driving lever placed in slot 21 places the minor axis of the elliptical inner surface of ring portion 23 in a reference position coincident with the axis of core 11; in this position the air gaps 25 and 26 are a minimum and therefore the reluctance of the magnetic circuit is a minimum. All intermediate adjustments are of course available.

As the reluctance of a magnetic circuit is decreased the inductance of the associated electrical circuit element is increased. Thus, the inductance of windings 10 is increased from a minimum to a maximum by the rotation of tuning member 22 90 degrees; continued rotation of tuning member 22 will again decrease the inductance to a minimum when a second 90° angle has been turned. Thus, the rotation of ring portion 23 of tuning member 22 causes concurrent variation of air gaps 25 and 26 in a common direction to vary the effective inductance of primary and secondary windings 10.

Figure 7:
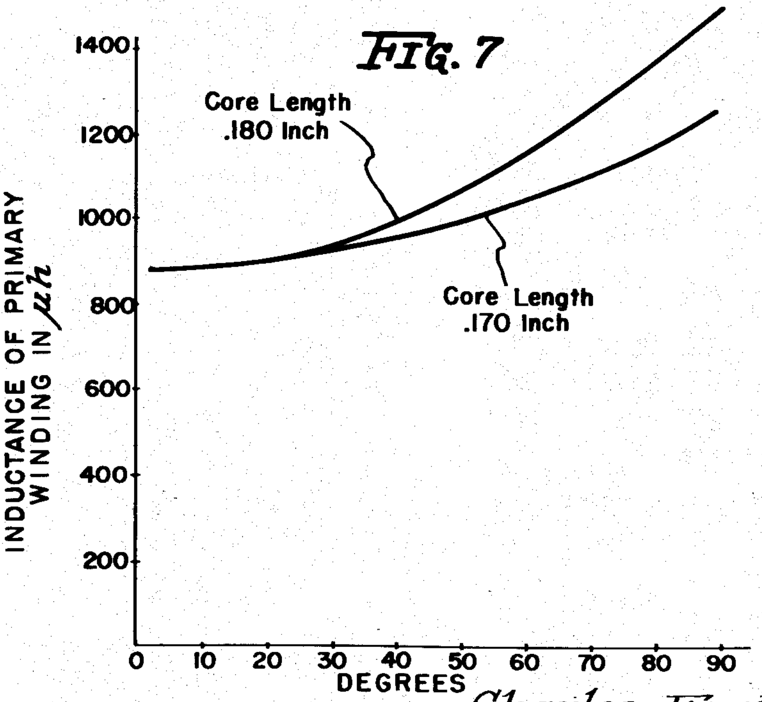
FIGURE 7 is a graphical representation of an operating characteristic of the IF transformer of FIGURE 1.

Variation of the inductance of the primary winding as a function of rotation of tuning member 22 is shown in the graph of FIGURE 7. The horizontal axis of the graph represents the angular displacement of tuning member 22 from 0° to 90° where the 0° point is with air gaps 25 and 26 a maximum and the 90° point is with air gaps 25 and 26 a minimum. The vertical axis or ordinate of the graph represents the inductance of the primary winding and is scaled in microhenrys. The data for this graph was taken from an IF transformer constructed in accordance with FIGURES 1–4. A ring portion 23 of elliptical inner configuration was used which had a minor axis of .182 inch and a major axis of .200 inch. The diameter of cylindrical core 11 was .070 inch. A primary winding of 300 turns of #40 AWG insulated copper wire was used. The length of core 11 is a parameter of the graph. With a core length of .170 inch, air gaps 25 and 26 have a minimum of .006 inch; with a core length of .180 inch each air gap is reduced to a minimum of .001 inch. As illustrated on the curve, primary inductance variations of as much as 65 percent have been obtained with 90 degrees rotation of tuning member 22, a variation which is ample to permit ready alignment in the intermediate-frequency circuits of a transistorized radio or the like.

While the dimensions of the miniaturized IF transformer of FIGURES 1–4 are not critical, the following constitutes specifications of a typical transformer with superior performance characteristics when used in a transistor pocket radio.

(1) Core 11:
- *a.* Diameter ------ .070 inch.
- *b.* Length -------- .170 inch.
- *c.* Material ------- Ferrite—high Q, high permeability for broadcast frequencies.

(2) Primary winding of core 11:
- *a.* 250 turns of #40 AWG insulated copper.

(3) Capacitor 18:
- *a.* Type ---------------------------- Silver mica.
- *b.* Size ---------------------------- 125 mmf.

(4) Tuning member 22:
- *a.* Minor axis ------------- .190 inch.
  Major axis ------------- .218 inch.
- *b.* Overall height ---------- .250 inch.
- *c.* Outer diameter --------- .270 inch.
- *d.* Material --------------- Ferrite (same as core).

(5) Support member 14:
- *a.* Overall height ----------------- .450 inch.
- *b.* Base—Length and depth --------- .275 inch.
  Height ----------------- .100 inch.
- *c.* Material --------------------- Thermoplastic nylon type.

(6) Shield can 27:
- *a.* Height --------------- .555 inch.
- *b.* Inner length and depth --- .275 inch.
- *c.* Material --------------- Cadmium plated brass.

Tuning member 22 also serves as a magnetic shielding member by providing a path of least resistance for the flux produced by windings 10. Since member 22 almost completely surrounds core 11, almost all flux is contained in this area and losses are thereby reduced. Member 22 is also an effective shield against external electromagnetic radiation. As an added precaution electrical shielding device or shield can 27 is provided which acts as a shield both for windings 10 and capacitor 18. Although the shield can 27 is not absolutely necessary to shield windings 10 since tuning member 22 does it adequately the provision of shield can 27 permits the use of an inexpensive unshielded construction for capacitor 18; as previously mentioned, shield can 27 also serves the purpose of retaining member 22 in mating engagement with cylindro-segmental bearing surfaces 19 and 20.

Figure 5:
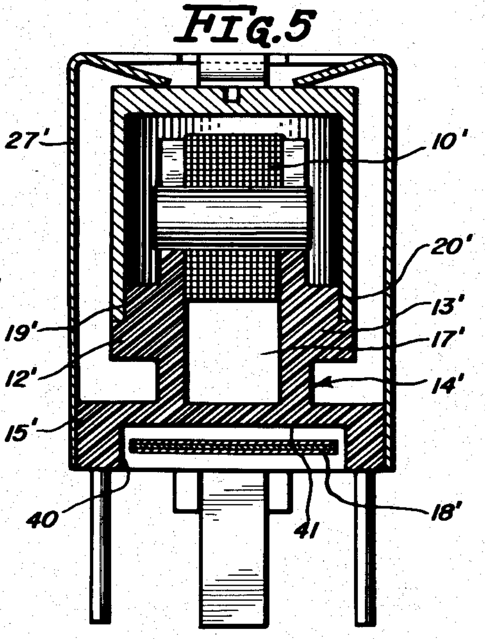
FIGURE 5 is a sectional view of an alternative embodiment of the invention.

FIGURE 5 shows an alternative embodiment which provides an even greater degree of miniaturization. Support member 14' of FIGURE 5 comprises a base portion 15' and vertically extending members 12' and 13' which include cylindro-segmental external bearing surfaces 19' and 20'. Base 15' differs from base 15 of FIGURES 1–4 in that it includes a horizontally oriented recess or receptacle 40 which contains capacitor 18'. The capacitor is held in place by means of its leads (not shown). With this construction, members 12' and 13' may be reduced in vertical size thus reducing the overall height of the IF transformer. However, a vertically oriented receptacle 17' is still retained to facilitate the placement of terminal pins in base 15' and the connection of the leads of windings 10' and capacitor 18' to the pins. A shield can 27' extends beyond bottom surface 41 of base 15' and also beyond capacitor 18' thereby effectively shielding the capacitor.

Figure 6:
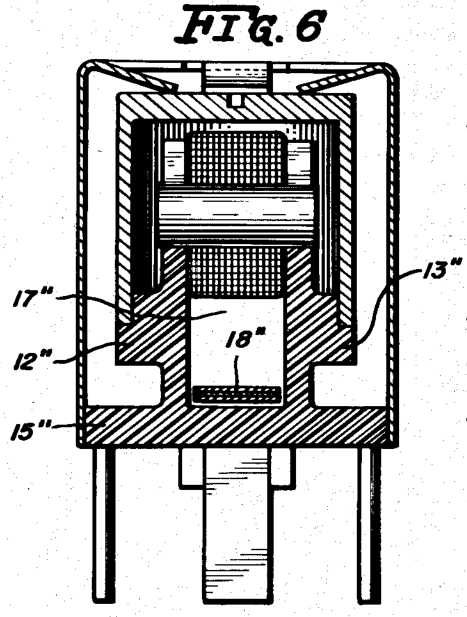
FIGURE 6 is a sectional view of a further embodiment of the invention.

FIGURE 6 shows still another embodiment of the invention, in which a wafer capacitor 18'' of even smaller size is horizontally received at the lower extremity of the receptacle 17'' between vertical support members 12'' and 13'' and above base portion 15''.

Thus the invention provides a tuning device such as an IF transformer which is highly miniaturized but yet has adequate values of "Q" and inductance and is still inexpensive and simple to construct. An improved mode of tuning is provided which gives a wide range of adjustment. The use of a threadless construction for the tuning member simplifies its manufacture and reduces its cost.

This type of construction also remedies an inherent disadvantage of prior art tuning members using a threaded construction in that no additional vertical clearance is required for adjusting the tuning member. In addition, the shield can performs an added function of retaining the components together in mutually assembled operative relation.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. An intermediate-frequency transformer for use in miniaturized radios and the like comprising: a cylindrical core of high-permeability ferrite material; primary and secondary windings encompassing said core; a support member of insulating material including a base portion and a pair of spaced vertically extending members for receiving and maintaining said cylindrical core with its axis horizontally oriented, said vertically extending members each having a cylindro-segmental external bearing surface intermediate said core and said base portion; a cup-shaped ferrite tuning member surrounding said core and comprising a ring portion and a lip portion having a cylindrical internal surface in slidable frictional engagement with said external bearing surfaces of said vertically extending members to establish a magnetic circuit including said ring portion and said core with a pair of air gaps at least one being adjustable by rotation of said tuning member.

2. An intermediate-frequency transformer for use in miniaturized radios and the like comprising: a cylindrical core of high-permeability ferrite material; primary and secondary windings encompassing said core; a support member of insulating material including a base portion and a pair of spaced vertically extending members for receiving and maintaining said cylindrical core with its axis horizontally oriented, said vertically extending members each having a cylindro-segmental external bearing surface intermediate said core and said base portion; and a cup-shaped ferrite tuning member surrounding said core and comprising a ring portion of circular outer configuration and elliptical inner configuration and further comprising a lip portion having a cylindrical internal surface in slidable frictional engagement with said external bearing surfaces of said vertically extending members to establish a magnetic circuit including said ring portion and said core with a pair of air gaps concurrently adjustable, by rotation of said tuning member, between a minimum when the minor axis of said elliptical inner surface is in a reference position coincident with the axis of said cylindrical core and a maximum when the major axis of said elliptical inner surface is in said reference position.

3. An intermediate-frequency transformer for use in miniaturized radios and the like comprising: a cylindrical core of high-permeability ferrite material; primary and secondary windings encompassing said core; a support member of insulating material including a base portion and a pair of spaced vertically extending members for receiving and maintaining said cylindrical core with its axis horizontally oriented, said vertically extending members each having a threadless cylindro-segmental external bearing surface spaced a predetermined vertical distance below said core; a cup-shaped ferrite tuning member surrounding said core and comprising a ring portion of circular outer configuration and elliptical inner configuration and further comprising a lip portion having a threadless cylindrical internal surface in slidable frictional engagement with said external bearing surfaces of said vertically extending members to establish a magnetic circuit including said ring portion and said core with a pair of air gaps concurrently adjustable, by rotation of said tuning member, between a minimum when the minor axis of said elliptical inner surface is in a reference position coincident with the axis of said cylindrical core and a maximum when the major axis of said elliptical inner surface is in said reference position; and a shield can of electrically conductive material having one end portion engaging said base portion of said support member and having another end portion provided with resilient tabs engaging the base of said cup-shaped tuning member to retain said tuning member in mating engagement with said support member while permitting rotation thereof.

4. An intermediate-frequency transformer for use in miniaturized radios and the like comprising: a cylindrical core of high-permeability ferrite material; primary and secondary windings encompassing said core; a support member of insulating material including a base portion and a pair of spaced vertically extending members for receiving and maintaining said cylindrical core with its axis horizontally oriented and providing an intervening vertically oriented receptacle, said vertically extending members each having a cylindro-segmental external bearing surface intermediate said core and said receptacle; a cup-shaped ferrite tunning member surrounding said core and comprising a ring portion of circular outer configuration and elliptical inner configuration and further comprising a lip portion having a cylindrical internal surface in slidable frictional engagement with said external bearing surfaces of said vertically extending members to establish a magnetic circuit including said ring portion and said core with a pair of air gaps concurrently adjustable, by rotation of said tuning member, between a minimum when the minor axis of said elliptical inner surface is in a reference position coincident with the axis of said cylindrical core and a maximum when the major axis of said elliptical inner surface is in said reference position; and a miniature wafer-type capacitor disposed in said receptacle and connected in parallel with at least a portion of one of said windings.

5. An intermediate-frequency transformer for use in miniaturized radios and the like comprising: a cylindrical core of high-permeability ferrite material; primary and secondary windings encompassing said core; a support member of insulating material including a base portion and a pair of spaced vertically extending members for receiving and maintaining said cylindrical core with its axis horizontally oriented and providing an intervening vertically oriented receptacle, said vertically extending members each having a cylindro-segmental external bearing surface intermediate said core and said receptacle; a cup-shaped ferrite tuning member surrounding said core and comprising a ring portion of circular outer configuration and elliptical inner configuration and further comprising a lip portion having a cylindrical internal surface in slidable frictional engagement with said external bearing surfaces of said vertically extending members to establish a magnetic circuit including said ring portion and said core with a pair of air gaps concurrently adjustable, by rotation of said tuning member, between a minimum when the minor axis of said elliptical inner surface is in a reference position coincident with the axis of said cylindrical core and a maximum when the major axis of said elliptical inner surface is in said reference position; a miniature wafer-type capacitor disposed in said receptacle and connected in parallel with at least a portion of one of said windings; and a shield can of electrically conductive material having one end portion engaging said base portion of said support member and having another end portion provided with resilient tabs engaging the base of said cup-shaped tuning member to retain said tuning member in mating engagement with said support member while permitting rotation thereof.

6. An intermediate-frequency transformer for use in miniaturized radios and the like comprising: a cylindrical core of high-permeability ferrite material; primary and secondary windings encompassing said core; a support member of insulating material including a base portion and a pair of spaced vertically extending members for receiving and maintaining said cylindrical core with its axis horizontally oriented, said support member including a receptacle or recess and said vertically extending members each having a cylindro-segmental external bearing surface intermediate said core and said base portion; a cup-shaped ferrite tuning member surrounding said core and comprising a ring portion of circular outer configuration and elliptical inner configuration and further comprising a lip portion having a cylindrical internal surface in slidable frictional engagement with said external bearing surfaces of said vertically extending members to establish a magnetic circuit including said ring portion and said core with a pair of air gaps concurrently adjustable, by rotation of said tuning member, between a minimum when the minor axis of said elliptical inner surface is in a reference position coincident with the axis of said cylindrical core and a maximum when the major axis of said elliptical inner surface is in said reference position; and a miniature wafe-type capacitor disposed in said recess or receptacle and connected in parallel with at least a portion of one of said windings.

7. An intermediate-frequency transformer for use in miniaturized radios and the like comprising: a cylindrical core of high-permeability ferrite material; primary and secondary windings encompassing said core; a support member of insulating material including a base portion and a pair of spaced vertically extending members for receiving and maintaing said cylindrical core with its axis horizontally oriented, said base portion having a horizontally oriented receptacle or recess and said vertically extending members each having a cylindro-segmental external bearing surface intermediate said core and said base portion; a cup-shaped ferrite tuning member surrounding said core and comprising a ring portion of circular outer configuration and elliptical inner configuration and further comprising a lip portion having a cylindrical internal surface in slidable frictional engagement with said external bearing surfaces of said vertically extending members to establish a magnetic circuit including said ring portion and said core with a pair of air gaps concurrently adjustable, by rotation of said tuning member, between a minimum when the minor axis of said elliptical surface is in a reference position coincident with the axis of said cylindrical core and a maximum when the major axis of said elliptical inner surface is in said reference position; and a miniature wafer-type capacitor disposed in said receptacle or recess and connected in parallel with at least a portion of one of said windings.

8. An intermediate-frequency transformer for use in miniaturized radios and the like comprising: a cylindrical core of high-permeability ferrite material; primary and secondary windings encompassing said core; a support member of insulating material including a base portion and a pair of spaced vertically extending members for receiving and maintaining said cylindrical core with its axis horizontally oriented said vertically extending members each having a cylindro-segmental external bearing surface intermediate said core and said base portion; a cup-shaped ferrite tuning member surrounding said core and comprising a ring portion of circular outer configuration and elliptical inner configuration and further comprising a lip portion having a cylindrical internal surface in slidable frictional engagement with said external bearing surfaces of said vertically extending members to establish a magnetic circuit including said ring portion and said core with a pair of air gaps concurrently adjustable, by rotation of said tuning member, between a minimum when the minor axis of said elliptical surface is in a reference position coincident with the axis of said cylindrical core and a maximum when the major axis of said elliptical inner surface is in said reference position; and a miniature horizontally oriented wafer-type capacitor received between said spaced vertically extending members and connected in parallel with at least a portion of one of said windings.

References Cited in the file of this patent

UNITED STATES PATENTS

| | | |
|---|---|---|
| 1,699,142 | Hendricks | Jan. 15, 1929 |
| 1,964,265 | Markley | June 26, 1934 |
| 1,997,453 | Crossley et al. | Apr. 9, 1935 |
| 2,503,879 | MacDonald | Apr. 11, 1950 |

FOREIGN PATENTS

| | | |
|---|---|---|
| 417,376 | Great Britain | Oct. 1, 1934 |
| 1,085,135 | France | July 21, 1954 |